(12) United States Patent
Vashchenko et al.

(10) Patent No.: US 7,126,168 B1
(45) Date of Patent: Oct. 24, 2006

(54) SILICON CONTROLLED RECTIFIER STRUCTURES WITH REDUCED TURN ON TIMES

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 162 days.

(21) Appl. No.: 10/821,287

(22) Filed: Apr. 9, 2004

(51) Int. Cl.
*H01L 29/49* (2006.01)
(52) U.S. Cl. ........................ 257/155; 257/162
(58) Field of Classification Search ................ 257/155, 257/162, 175, 176, 506
See application file for complete search history.

(56) References Cited

U.S. PATENT DOCUMENTS

| | | | |
|---|---|---|---|
| 6,433,368 B1 | 8/2002 | Vashchenko et al. | ........ 257/173 |
| 6,541,801 B1 | 4/2003 | Vashchenko et al. | ........ 257/119 |
| 6,998,651 B1 * | 2/2006 | Vashohenko et al. | ........ 257/133 |

OTHER PUBLICATIONS

Christian C. Russ et al., "GGSCRs: GGNMOS Triggered Silicon Controlled Rectifiers for ESD Protection in Deep Sub-Micron CMOS Processes", Published at the 2001 EOS/ESD Symposium, Sep. 8-14, 2001, pp. 1A.3.1-1A.3.10.

* cited by examiner

*Primary Examiner*—Mark V. Prenty
(74) *Attorney, Agent, or Firm*—Mark C. Pickering

(57) ABSTRACT

The turn on time of an electrostatic discharge (ESD) structure, such as a silicon controlled rectifier (SCR), a low-voltage triggering SCR (LVTSCR), and a bipolar SCR (BSCR), is reduced by turning on the structure in two steps: a first step that locally turns on the pnp and npn transistors, and a second step that, over time, fully turns on the structure.

30 Claims, 9 Drawing Sheets

SILICON CONTROLLED RECTIFIER STRUCTURES WITH REDUCED TURN ON TIMES

BACKGROUND OF THE INVENTION

1. Field of the Invention

The present invention relates to silicon-controlled rectifier structures and, more particularly, to silicon controlled rectifier structures with reduced turn on times.

2. Description of the Related Art

A silicon-controlled rectifier (SCR) is a device that provides an open circuit between a first node and a second node when the voltage across the first and second nodes is positive and less than a breakdown voltage. When the voltage across the first and second nodes rises to be equal to or greater than the breakdown voltage, the SCR provides a low-resistance current path between the first and second nodes. Further, once the low-resistance current path has been provided, the SCR maintains the current path as long as the voltage across the first and second nodes is equal to or greater than a holding voltage that is lower than the breakdown voltage.

As a result of these characteristics, SCRs have been used to provide electrostatic discharge (ESD) protection. When used for ESD protection, the first node becomes a to-be-protected node, and the second node becomes a grounding node. The SCR operates within an ESD protection window that has a maximum voltage defined by the destructive breakdown level of the to-be-protected node, and a minimum voltage (also known as a latch-up voltage) defined by any DC bias on the to-be-protected node. The breakdown voltage of the SCR is then set to a value that is less than the maximum voltage of the window, while the holding voltage is set to a value that is greater than the minimum voltage of the window.

Thus, when the voltage across the to-be-protected node and the grounding node is less than the breakdown voltage, the SCR provides an open circuit between the to-be-protected node and the grounding node. However, when the to-be-protected node receives a voltage spike that equals or exceeds the breakdown voltage, such as when an ungrounded human-body contact occurs, the SCR provides a low-resistance current path from the to-be-protected node to the grounding node. In addition, once the ESD event has passed and the voltage on the to-be-protected node falls below the holding voltage, the SCR again provides an open circuit between the to-be-protected node and the grounding node.

FIGS. 1A–1B show views that illustrate a prior-art, silicon controlled rectifier (SCR) 100. FIG. 1A shows a plan view of SCR 100, while FIG. 1B shows a cross-sectional view taken along line 1B—1B of FIG. 1A. As shown in FIGS. 1A–1B, SCR 100 has an n– well 112 which is formed in a, p– semiconductor material 110, such as a substrate or a well.

In addition, SCR 100 has a p+ finger region 114 that is formed in n– well 112 to have a first length L1, and an n+ finger region 116 that is formed in n– well 112 to have a second length L2 that is substantially equal to the first length L1. P+ and n+ finger regions 114 and 116, which are parallel to each other and approximately 100 microns in length, are both electrically connected to a to-be-protected node.

SCR 100 further has a trench isolation region STI that includes a first isolation section STI1 that contacts n– well 112 and p+ finger region 114, and a second isolation section STI2 that contacts n– well 112, p+ finger region 114, and n+ finger region 116. In addition, trench isolation region STI also includes a third isolation section STI3 that contacts p– material 110. The first, second, and third isolation sections STI1, STI2, and STI3 are substantially parallel.

As further shown in FIGS. 1A–1B, SCR 100 also has a p+ finger region 122 and an n+ finger region 124 that are formed in p– semiconductor material 110. P+ and n+ finger regions 122 and 124, which have third and fourth lengths L3 and L4, respectively, both contact and are located on opposite sides of the third isolation section STI3.

In addition, n+ finger region 124 contacts the first isolation section STI1. As additionally shown in FIGS. 1A–1B, the first, second, third, and fourth lengths L1, L2, L3, and L4 of p+ finger region 114, n+ finger region 116, p+ finger region 122, and n+ finger region 124, respectively, are substantially equal.

Further, SCR 100 includes a first layer of metal silicide 126A that is formed on p+ finger region 114, a second layer of metal silicide 126B that is formed on n+ finger region 116, a third layer of metal silicide 126C that is formed on p+ finger region 122, and a fourth layer of metal silicide 126D that is formed on n+ finger region 124.

SCR 100 additionally includes a layer of isolation material 128, and a number of contacts 130 that are formed through isolation layer 128 to make electrical connections with p+ finger region 114, n+ finger region 116, p+ finger region 122, and n+ finger region 124. SCR 100 also includes a first metal region 132 that is formed on isolation layer 128 to make an electrical connection with the contacts 130 that are connected to p+ finger region 114 and n+ finger region 116.

SCR 100 further includes a second metal region 134 that is formed on isolation layer 128 to make an electrical connection with the contacts 130 that are connected to p+ finger region 122 and n+ finger region 124. In addition, first metal region 132 is electrically connected to the to-be-protected node, while second metal region 134 is electrically connected to the grounding node.

In operation, when the voltage on metal region 132 is greater than the voltage on metal region 134 by a difference voltage that is less than the breakdown voltage, the voltage reverse biases the junction between n– well 112 and p-type material 110. The reverse-biased junction, in turn, blocks charge carriers from flowing from metal region 132 to metal region 134. However, when the voltage on metal region 132 spikes up to be equal to or greater than the breakdown voltage, the reverse-biased junction breaks down due to avalanche multiplication.

The breakdown of the junction causes a large number of holes to be injected into p– material 110, and a large number of electrons to be injected into n– well 112. The increased number of holes increases the potential of p– material 110 in the region that lies adjacent to n+ region 124, and eventually forward biases the junction between p– material 110 and n+ region 124.

When the increased potential forward biases the junction, a npn transistor, which utilizes n+ region 124 as the emitter, p-type material 110 as the base, and n– well 112 as the collector, turns on. When turned on, n+ (emitter) region 124 injects electrons into (base) material 110. Most of the injected electrons diffuse through (base) material 110 and are swept from (base) material 110 into (collector) n– well 112 by the electric field that extends across the reverse-biased junction. The electrons in (collector) n-well 112 are then collected by n+ region 116.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n– well 112 also decrease the potential of n-well 112 in the region that lies adjacent to p+ region 114, and eventually forward bias the junction between p+ region 114 and n– well 112. When the decreased potential forward biases the junction between p+ region 114 and n– well 112, a pnp transistor formed from p+ region 114, n-well 112, and material 110 turns on.

When turned on, p+ emitter 114 injects holes into base 112. Most of the injected holes diffuse through (base) n– well 112 and are swept from (base) n– well 112 into (collector) material 110 by the electric field that extends across the reverse-biased junction. The holes in (collector) material 110 are then collected by p+ region 122.

A small number of the holes injected into (base) n– well 112 recombine with electrons in (base) n– well 112 and are lost. The electrons lost to recombination with the injected holes are replaced by electrons flowing into n– well 112 as a result of the broken-down reverse-biased junction, and n– well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 124. Thus, a small part of the pnp collector current forms the base current of the npn transistor.

Thus, n+ region 124 injects electrons that provide both the electrons for the collector current of the npn transistor as well as the electrons for the base current of the pnp transistor. At the same time, p+ region 114 injects holes that provide both the holes for the collector current of the pnp transistor as well as the holes for the base current of the npn transistor.

One variation of the standard SCR structure, such as SCR 100, is to incorporate an NMOS transistor into SCR 100 to provide low-voltage triggering. FIGS. 2A–2B show views that illustrate a prior-art, low-voltage triggering SCR (LVTSCR) 200. FIG. 2A shows a plan view of LVTSCR 200, while FIG. 2B shows a cross-sectional view taken along line 2B—2B of FIG. 2A. LVRSCR 200 and SCR 100 are similar and, as a result, utilize the same reference numerals to designate the structures that are common to both devices.

As shown in FIGS. 2A–2B, LVTSCR 200 differs from SCR 100 in that LVTSCR 200 has an n+ (floating drain) finger region 210 that is formed in both p– material 110 and n– well 112, and a channel region 212 that is located between n+ (source) finger region 124 and n+ (floating drain) finger region 210. In addition, LVTSCR 200 includes a gate oxide layer 214 that is formed on p– material 110 over channel region 212, a gate 216 that is formed on gate oxide layer 214, and a layer of metal silicide 218 that is formed on n+ finger region 210. N+ (source and drain) finger regions 124 and 210, gate oxide layer 214, gate 216, and metal silicide layer 218 define a NMOS transistor 220 which is typically formed to be identical to the to-be-protected MOS transistors in the circuit.

In operation, when the voltage on the drain of a conventional NMOS transistor spikes up, the drain-to-substrate junction of the NMOS transistor breaks down, for example, at 7 volts, while the gate oxide layer that isolates the gate from the drain destructively breaks down at, for example, 10–15 volts.

Since NMOS transistor 220 is formed to be identical to the to-be-protected MOS transistors, the junction between n+ region 210 and p– material 110 breaks down at the same time that the to-be-protected MOS transistors experience junction break down as a result of an ESD pulse. Once the reverse-biased junction between n+ region 210 and p– material 110 breaks down, the break down triggers LVRSCR 200 to operate the same as SCR 100.

Since junction break down occurs before the MOS transistors experience destructive gate oxide break down, LVTSCR 200 turns on before destructive gate oxide breakdown occurs, thereby protecting the MOS transistors. Thus, the junction break down voltage, which is less than the voltage level that causes destructive gate oxide break down, functions as the breakdown voltage.

In addition, other techniques, such as reducing the width of channel region 212, can be used to lower the breakdown voltage so that the n+ region 210 to p– material 110 junction breaks down before the to-be-protected MOS transistors experience junction break down. Thus, LVTSCR 200 provides a SCR with a significantly lower turn on voltage that allows MOS transistors to be protected from ESD events.

In addition to SCR 100 and LVRSCR 200, another well known SCR type structure is a bipolar SCR (BSCR). FIGS. 3A–3B show views that illustrate a prior-art, bipolar SCR (BSCR) 300. FIG. 3A shows a plan view of BSCR 300, while FIG. 3B shows a cross-sectional view taken along line 3B—3B of FIG. 3A.

As shown in FIGS. 3A–3B, BSCR 300 includes a p– substrate 310, an n+ buried layer 312 that is formed in the top surface of substrate 310, and an n– epitaxial layer 314 that is formed on the top surface of substrate 310. BSCR 300 further has a trench isolation region STI that includes a first isolation section STI1, a second isolation section STI2, and a third isolation section STI3 that are formed in, and contact, n– epitaxial layer 314. The first, second, and third isolation sections STI1, STI2, and STI3 are spaced-apart and substantially parallel.

In addition, BSCR 300 includes a p– base finger region 316 that is formed in the top surface of epitaxial layer 314 to have a first length L1, and a p+ surface finger region 320 that is formed in the top surface of epitaxial layer 314 to have a second length L2 that is substantially equal to the first length L1. BSCR 300 also includes an n+ sinker finger region 322 that is formed in epitaxial layer 314 to have a third length L3 that is substantially equal to the first and second lengths L1 and L2.

BSCR 300 further includes an n+ polysilicon emitter region 324 that is formed on and along a region of the top surface of p– base region 316. In addition, outdiffusion from n+ emitter region 324 forms a small n+ region 326 in the top surface of p– base region 316. In addition, BSCR 300 includes a first metal silicide layer 328A that is formed on and along an edge of p-base region 316, a second metal silicide layer 328B that is formed on p+ surface finger region 320, a third metal silicide layer 328C that is formed on n+ sinker finger region 322, and a fourth metal silicide layer 328D that is formed on polysilicon emitter region 324.

BSCR 300 also includes a layer of isolation material 332 that is formed over epitaxial layer 314, and a plurality of contacts 334 that are formed through isolation layer 332 to make an electrical connection with p– base region 316 via metal silicide layer 328A, p+ surface finger region 320 via metal silicide layer 328B, n+ sinker finger region 322 via metal silicide layer 328C, and n+ poly emitter region 324 via metal silicide layer 328D.

Further, a first metal region 340, which can function as the anode of an ESD diode structure (where the anode is connected to a to-be-protected device, such as the gate of a MOS transistor), is formed on isolation layer 332 to make an electrical connection with the contacts 334 that are electrically connected to p+ surface finger region 320 and n+ sinker finger region 322.

In addition, a second metal region 342, which can function as the cathode of the ESD diode structure (where the cathode is connected to a grounding node), is formed on isolation layer 332 to make an electrical connection with the contacts 334 that are electrically connected to n+ poly emitter region 324. A third metal region 344, which can be resistively connected to second metal region 342, is formed on isolation layer 332 to make an electrical connection with the contacts 334 that are electrically connected to p− base region 316.

BSCR 300 forms an npn bipolar transistor that utilizes n+ region 326 as the emitter, p− base region 316 as the base, and n+ buried layer 312, n− epitaxial layer 314, and n+ sinker finger region 322 as the collector. BSCR 300 also forms a pnp transistor that utilizes p+ surface finger region 320 as the emitter, n+ buried layer 312 and n− epitaxial layer 314 as the base, and p− base region 316 as the collector.

In operation, when a voltage on the anode of BSCR 300 rises with respect to the voltage on the cathode, the voltage on n+ sinker finger region 322 and n− epitaxial layer 314 rises with respect to the voltage on p− base region 316, thereby reverse biasing the pn junction between p− base region 316 and n− epitaxial layer 314. As a result, BSCR 300 blocks a current, other than a leakage current, from flowing from the anode to the cathode until the anode-to-cathode voltage exceeds a breakdown voltage.

When the rising voltage on the anode exceeds the breakdown voltage, avalanche multiplication causes large numbers of electrons to be injected into n− epitaxial layer 314 and large numbers of holes to be injected into p− base region 316. The electrons injected into n− epitaxial layer 314 follow a current path through n− epitaxial layer 314, n+ buried layer 312, and n+ sinker region 322.

The increased number of electrons in n− epitaxial layer 314 reduces the potential at the pn junction between p+ surface finger region 320 and n− epitaxial layer 314 which, in turn, forward biases the pn junction between p+ surface finger region 320 and n− epitaxial layer 314, thereby allowing p+ surface finger region 320 to inject holes into n− epitaxial layer 314.

In addition, the holes injected into p− base region 316 increase the potential in p− base region 316 which, in turn, forward biases the pn junction between p− base region 316 and n+ emitter region 326. When forward biased, n+ emitter region 326 injects electrons into p− base region 316.

Further, the accumulation of positive charge in p− base region 316, and the accumulation of negative charge in n− epitaxial layer 314 due to the injection of large numbers of holes and electrons, respectively, reduces the magnitude of the reversed biased junction until the pn junction between p− base region 316, and n− epitaxial layer 314 switches and becomes forward biased. Once the pn junction between p− base region 316 and n− epitaxial layer 314 becomes forward biased, a large current flows from the anode to the cathode, while the anode-to-cathode voltage drops to a holding voltage that is substantially lower than the breakdown voltage.

One problem with large SCR structures, such as SCR 100, LVTSCR 200, and BSCR 300, is that it takes a reasonably long time to turn these structures on due to the capacitance associated with the structures. Thus, there is a need for a large SCR structure that has a reduced turn on time.

DETAILED DESCRIPTION OF THE INVENTION

Figure 1A:
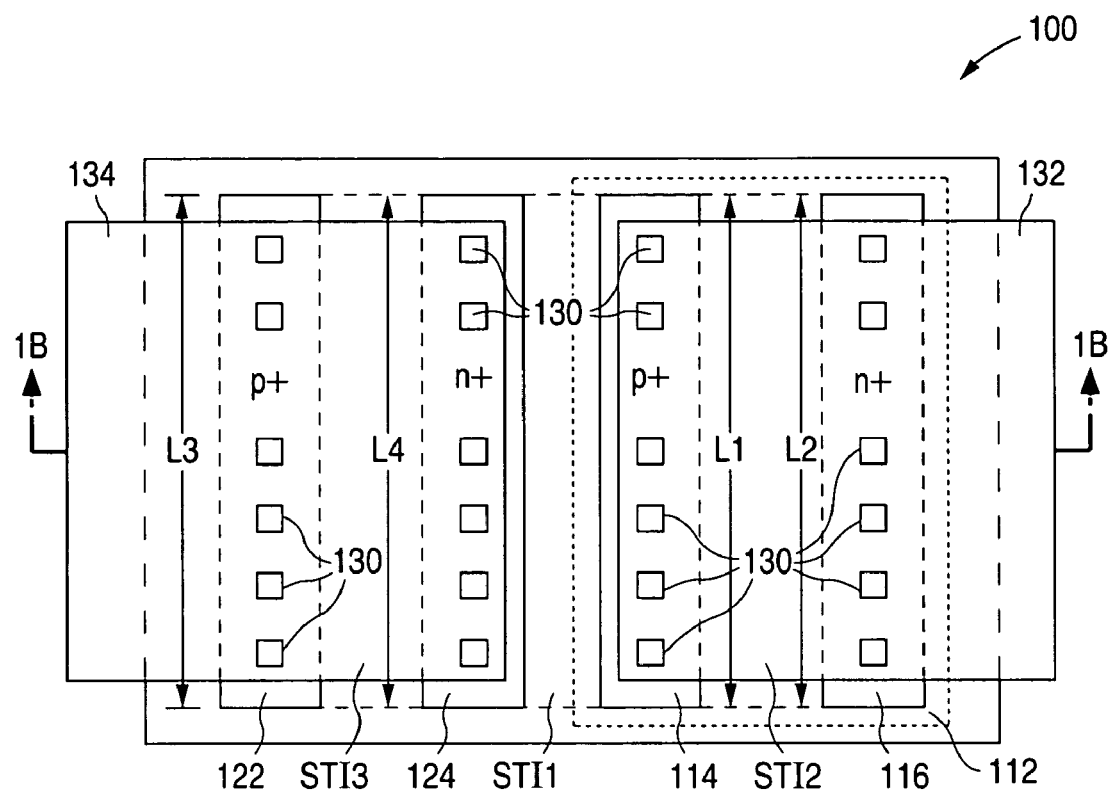
FIGS. 1A–1B are views illustrating a prior-art, silicon controlled rectifier (SCR) 100.
Figure 1B:
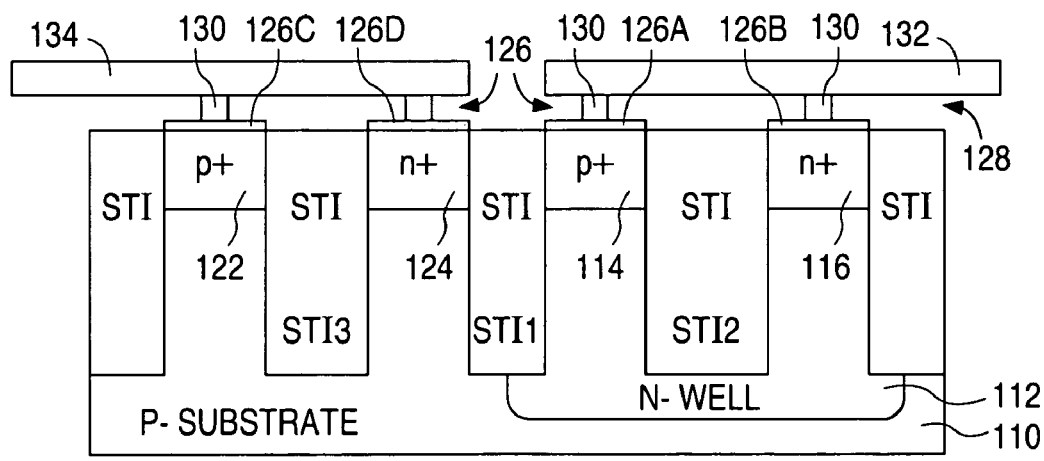
Figure 2A:
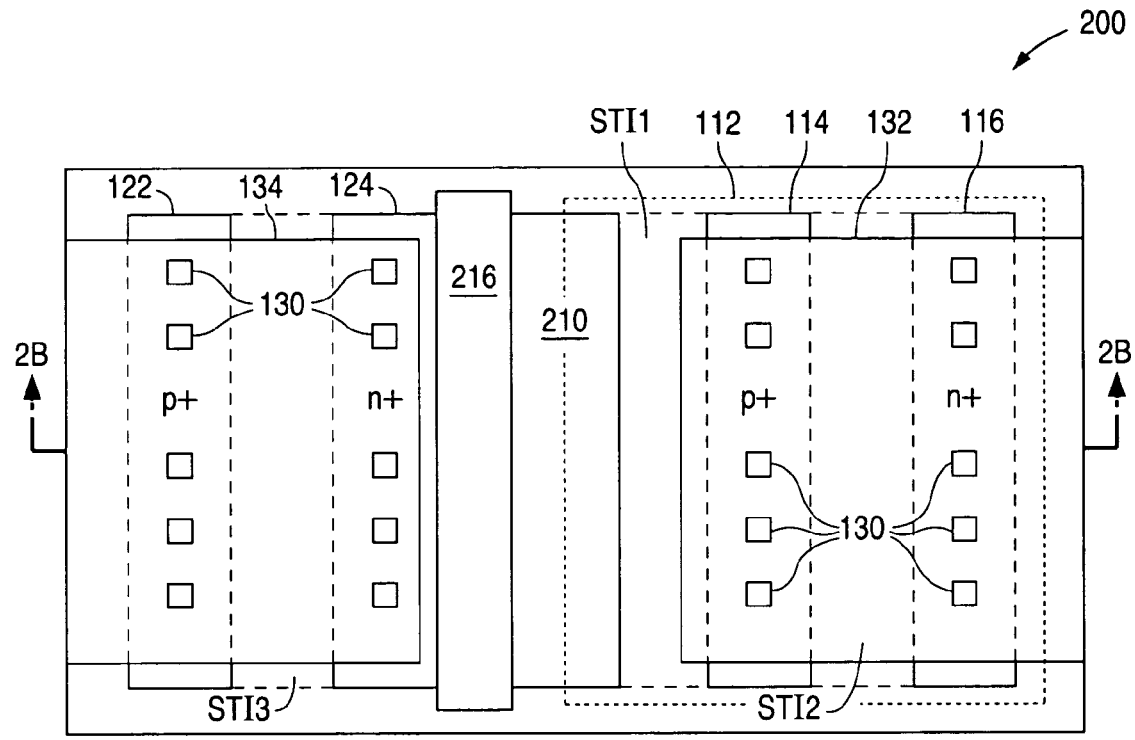
FIGS. 2A–2B are views illustrating a prior-art, low-voltage triggering SCR (LVTSCR) 200.
Figure 2B:
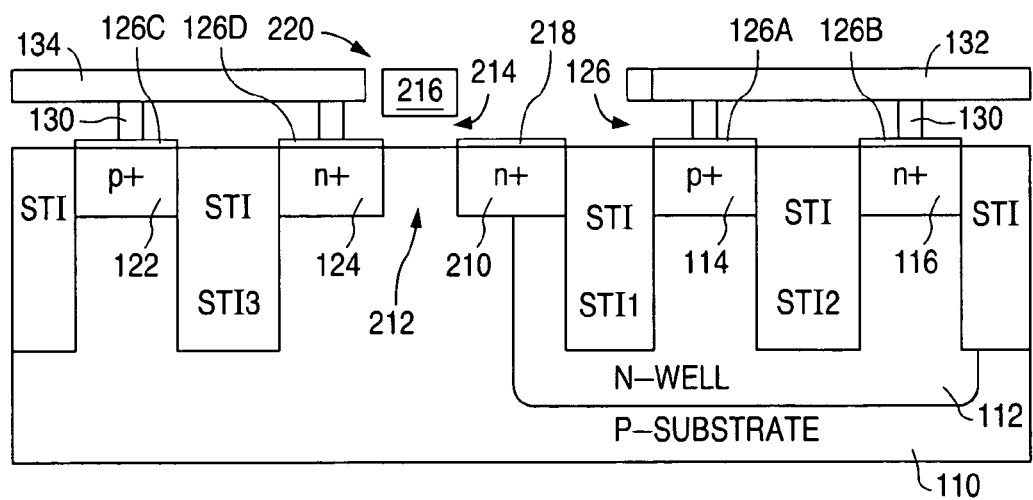
Figure 3A:
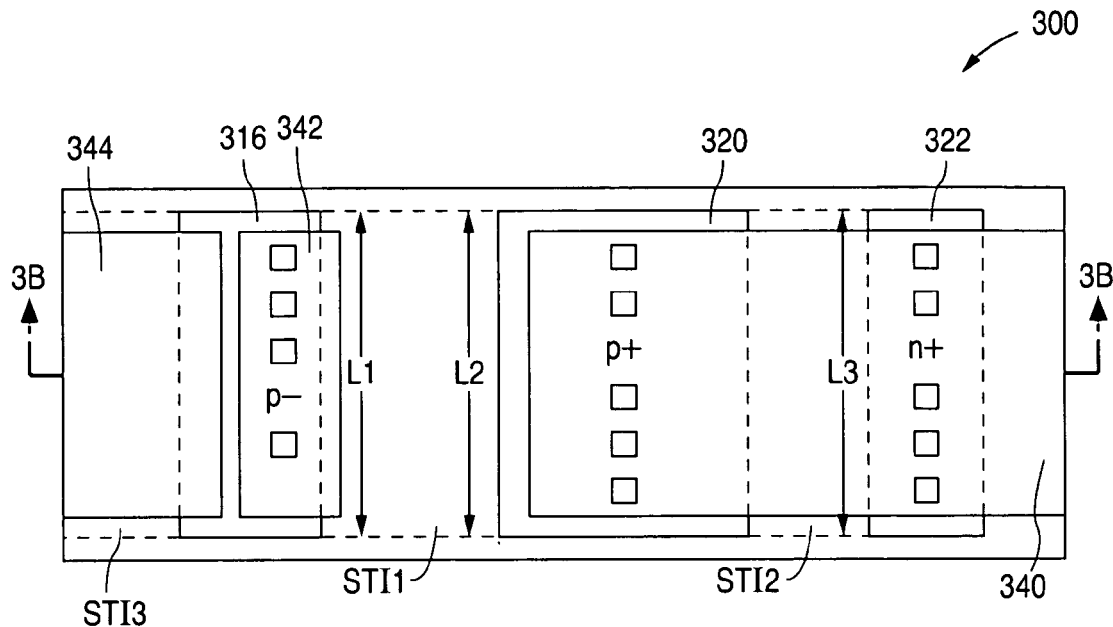
FIGS. 3A–3B are views illustrating a prior-art, bipolar SCR (BSCR) 300.
Figure 3B:
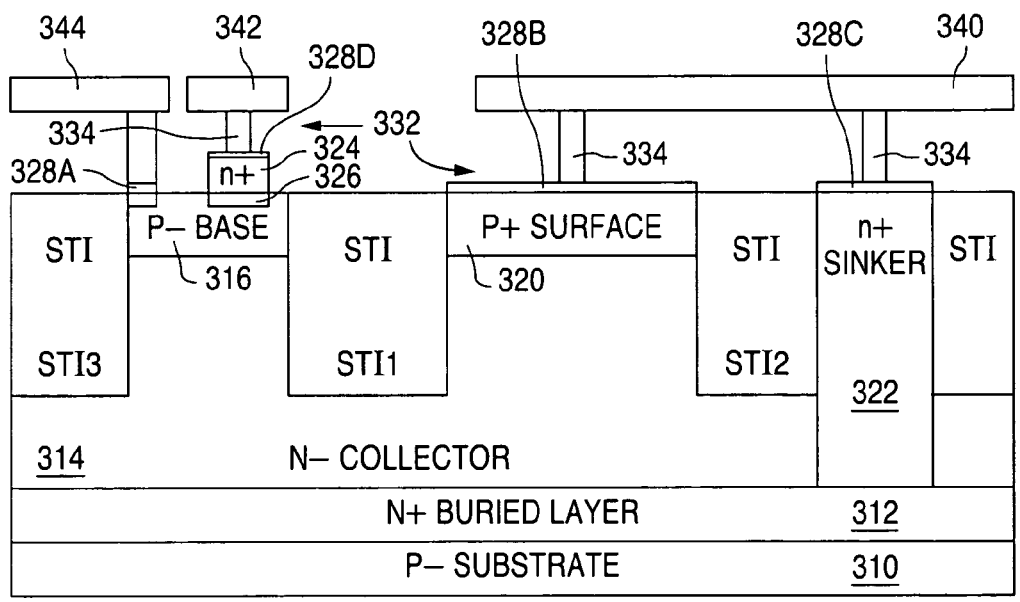
Figure 4A:
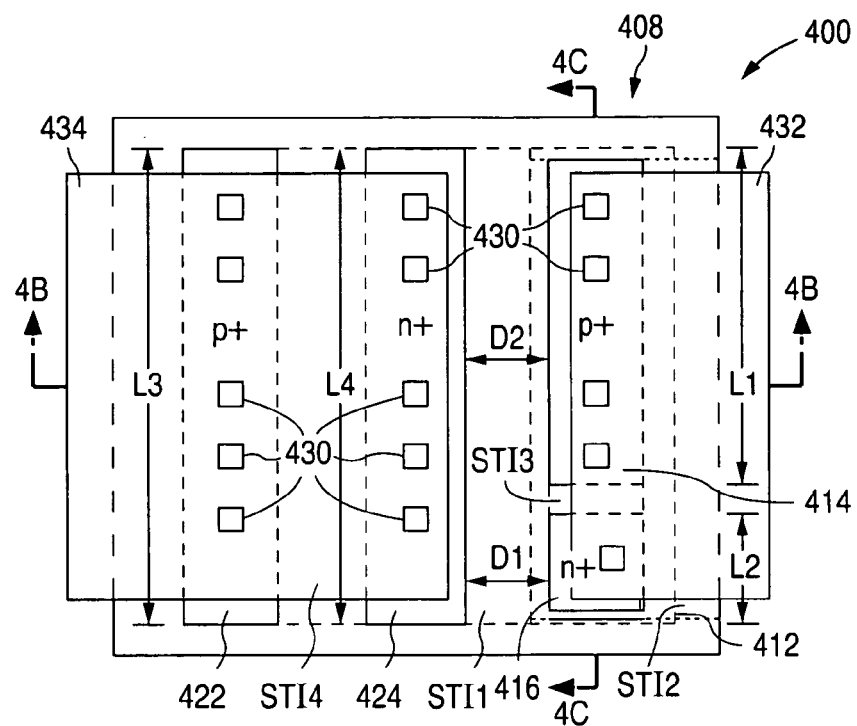
FIGS. 4A–4C are views illustrating an example of a silicon controlled rectifier (SCR) 400 in accordance with the present invention.
Figure 4B:
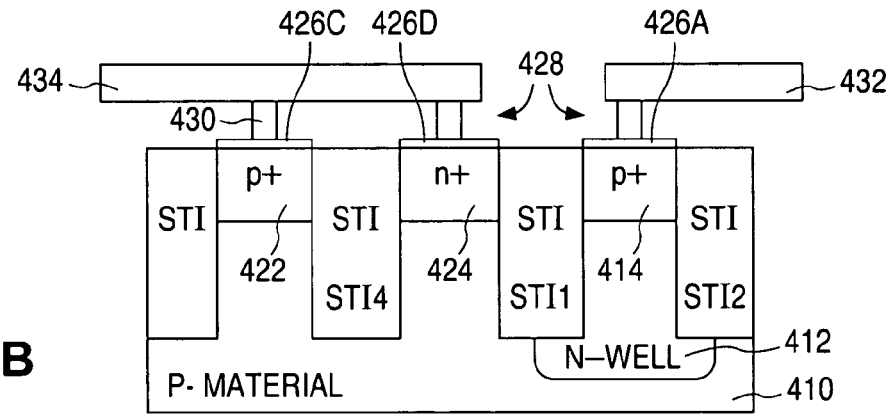
Figure 4C:
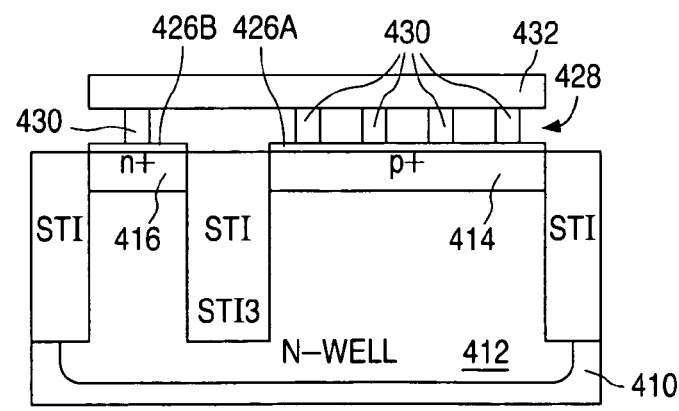

FIGS. 4A–4C show views that illustrate an example of a silicon controlled rectifier (SCR) 400 in accordance with the present invention. FIG. 4A shows a plan view of SCR 400, while FIG. 4B shows a cross-sectional view taken along line 4B—4B of FIG. 4A, and FIG. 4C shows a cross-sectional view taken along line 4C—4C of FIG. 4A.

As shown in FIGS. 4A–4C, SCR 400 has an anode structure 408 that includes an n− well 412 which is formed in a p− semiconductor material 410, such as a substrate or a well. In addition, anode structure 408 has a p+ finger region 414 that is formed in n− well 412 to have a first length L1, and an n+ region 416 that is formed in n-well 412 to have a second length L2. P+ and n+ regions 414 and 416 are both connected to a to-be-protected node, such as the gate of a MOS transistor. As shown in the plan view, the first length L1 of p+ finger region 414 is substantially longer than the second length L2 of n+ region 416.

SCR 400 further has a trench isolation region STI that includes a first isolation section STI1 that contacts n-well 412 and p+ finger region 414, and a second isolation section STI2 that contacts n-well 412, p+ finger region 414, and n+ region 416. In this example, p+ and n+ regions 414 and 416 both lie between the first and second isolation sections STIL and STI2, which are substantially parallel and longer than p+ finger region 414 and n+ region 416.

In addition, trench isolation region STI also includes a third isolation section STI3 that contacts the first and second isolation sections STI1 and STI2, and isolates p+ finger region 414 from n+ region 416. Trench isolation region STI also includes a fourth isolation section STI4 that runs parallel with the first and second isolation sections STIL and STI2, and contacts p− material 410.

As further shown in FIGS. 4A–4C, SCR 400 also has a p+ finger region 422 and an n+ finger region 424 that are formed in p− semiconductor material 410. P+ and n+ finger regions 422 and 424, which have third and fourth lengths L3 and L4, both contact, and are located on opposite sides of, the fourth isolation section STI4. In addition, n+ finger region 424 contacts the first isolation section STI1.

As additionally illustrated in the example shown in FIGS. 4A–4C, the third length L3 of p+ region 422, which can be, for example, 100 microns, is longer than the first length L1, substantially longer than the second length L2, and substantially equal to the fourth length L4. Lengths L1, L2, L3, and L4 are measured along substantially parallel or coincident lines.

Further, SCR 400 includes a first layer of metal silicide 426A that is formed on p+ finger region 414, a second layer of metal silicide 426B that is formed on n+ region 416, a third layer of metal silicide 426C that is formed on p+ finger region 422, and a fourth layer of metal silicide 426D that is formed on n+ finger region 424.

In addition, a shortest distance D1 between n+ region 424 and n+ region 416, and a shortest distance D2 between n+ region 424 and p+ region 414 are substantially equal. Further, SCR 400 includes a layer of isolation material 428, and a number of contacts 430 that are formed through isolation layer 428 to make electrical connections with p+ finger region 414 via metal silicide layer 426A, n+ region 416 via metal silicide layer 426B, p+ finger region 422 via metal silicide layer 426C, and n+ finger region 424 via metal silicide layer 426D.

SCR 400 also includes a first metal region 432 that is formed on isolation layer 428 to make an electrical connection with the contacts 430 that are electrically connected to p+ finger region 414 and n+ region 416. SCR 400 further includes a second metal region 434 that is formed on isolation layer 426 to make an electrical connection with the contacts 430 that are electrically connected to p+ finger region 422 and n+ finger region 424.

In operation, when the voltage on metal region 432 is greater than the voltage on metal region 434 by a difference voltage that is less than the breakdown voltage, the voltage reverse biases the junction between n– well 412 and p-type material 410. The reverse-biased junction, in turn, blocks charge carriers from flowing from metal region 432 to metal region 434.

However, when the voltage on metal region 432 spikes up to be equal to or greater than the breakdown voltage, the reverse-biased junction breaks down due to avalanche multiplication. The breakdown of the junction, which first occurs at the point closest to n+ region 416, causes a large number of holes to be injected into p– material 410, and a large number of electrons to be injected into n-well 412, in a local region that lies close to n+ region 416. The increased number of holes locally increases the potential of p– material 410 in the region that lies adjacent to n+ region 424, which then locally forward biases the junction between material 410 and n+ region 424.

When the increased potential forward biases the junction, an npn transistor that utilizes n+ region 424 as the emitter, p– material 410 as the base, and n+ region 416 as the collector turns on in the local region. When turned on, n+ (emitter) region 424 injects electrons into p– (base) material 410 in the local region. Most of the injected electrons diffuse through p– (base) material 410 and are swept from p– (base) material 410 into (collector) n– well 412 by the electric field that extends across the reverse-biased junction. The electrons in (collector) n– well 412 are then collected by n+ region 416.

A small number of the electrons injected into (base) material 410 recombine with holes in (base) material 410 and are lost. The holes lost to recombination with the injected electrons are replaced by holes injected into (base) material 410 by the broken-down reverse-biased junction and, as described below, by the collector current of a pnp transistor, thereby providing the base current.

The electrons that are injected and swept into n– well 412 also locally decrease the potential of n-well 412 in the region that lies adjacent to p+ finger region 414, and eventually locally forward bias the junction between p+ finger region 414 and n– well 412. When the decreased potential forward biases the junction between p+ finger region 414 and n– well 412, a pnp transistor formed from p+ finger region 414, n– well 412, and p– material 410 turns on in the local region.

When turned on, p+ finger region 414 injects holes into n– well 412 in the local region. Most of the injected holes diffuse through (base) n– well 412 and are swept from (base) n– well 412 into p– (collector) material 410 by the electric field that extends across the reverse-biased junction. The holes in (collector) material 410 are then collected by p+ finger region 422.

A small number of the holes injected into (base) n– well 412 recombine with electrons in (base) n– well 412 and are lost. The electrons lost to recombination with the injected holes are replaced by electrons flowing into n– well 412 as a result of the broken-down reverse-biased junction, and n– well 412 being the collector of the npn transistor. Thus, a small part of the npn collector current forms the base current of the pnp transistor.

Similarly, as noted above, the holes swept into (collector) material 410 also provide the base current holes necessary to compensate for the holes lost to recombination with the diffusing electrons injected by n+ (emitter) region 424. Thus, a small part of the pnp collector current forms the base current of the npn transistor.

As a result, n+ region 424 locally injects electrons that provide both the electrons for the collector current of the npn transistor as well as the electrons for the base current of the pnp transistor. At the same time, p+ finger region 414 locally injects holes that provide both the holes for the collector current of the pnp transistor as well as the holes for the base current of the npn transistor.

After the npn and pnp transistors of SCR 400 have been turned on in the local region, which is adjacent to n+ region 416, the regions of the npn and pnp transistors of SCR 400 that lie further away from the local region turn on over time through the propagation of a conductivity modulation front that moves down p+ finger 414 in a wave-like fashion (a dV/dt effect).

Thus, in accordance with the present invention, SCR 400 is turned on in two steps: a first step wherein the npn and pnp transistors turn on locally, and a second step wherein SCR 400 is fully turned on over time as the turned on condition propagates down p+ finger 414. The npn and pnp transistors locally turn on quicker due to the reduced capacitance associated with the local region. Once locally turned on, the conductivity modulation front rapidly propagates down p+ finger 414, fully turning on SCR 400.

One of the advantages of SCR 400 is that by turning on SCR 400 in two steps, first locally, and then, over time, fully as a conductivity modulation front propagates down the finger, SCR 400 can be turned on faster (the voltage on the anode falls from the breakdown voltage to the holding voltage in less time) than SCR 100.

Figure 5A:
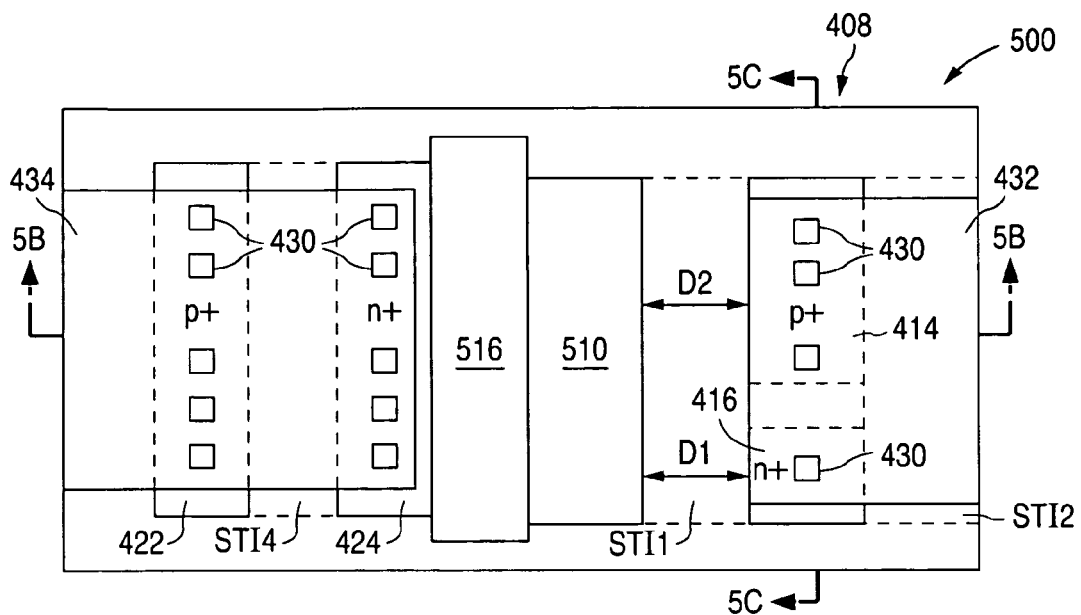
FIGS. 5A–5C are views illustrating a low-voltage triggering SCR (LVTSCR) 500 in accordance with the present invention.
Figure 5B:
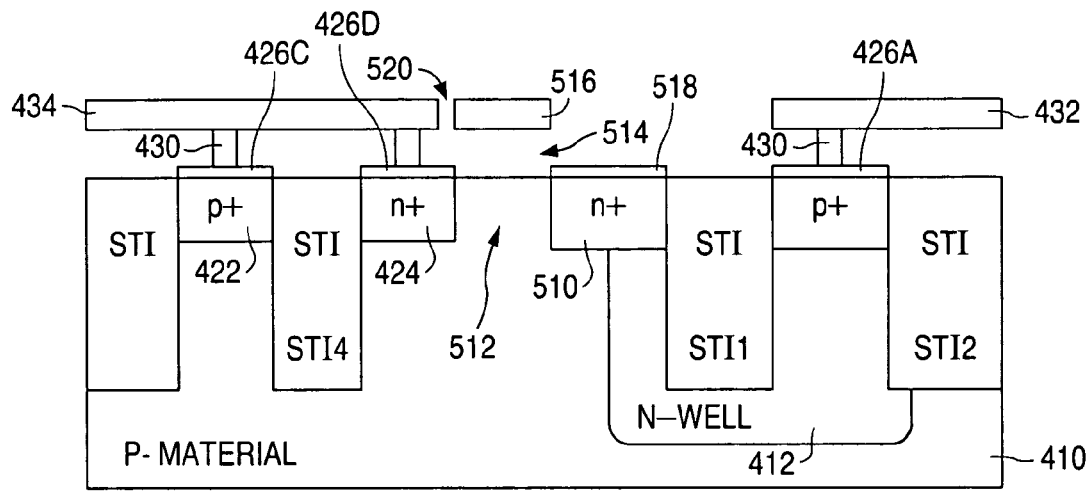
Figure 5C:
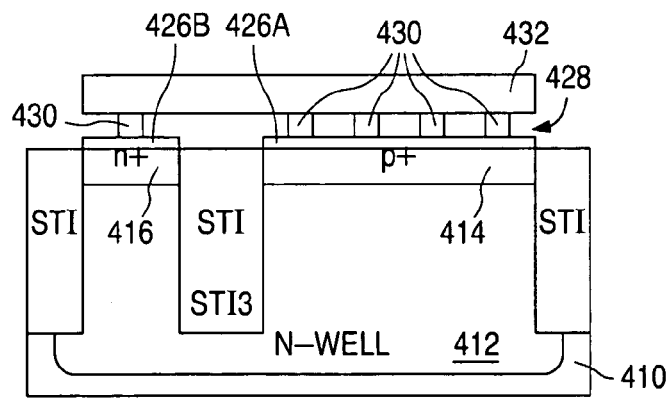

FIGS. 5A–5C show views that illustrate a low-voltage triggering SCR (LVTSCR) 500 in accordance with the present invention. FIG. 5A shows a plan view of LVTSCR 500, while FIG. 5B shows a cross-sectional view taken along line 5B—5B of FIG. 5A. LVTSCR 500 and SCR 400 are similar and, as a result, utilize the same reference numerals to designate the structures that are common to both devices.

As shown in FIGS. 5A–5C, LVTSCR 500 differs from SCR 400 in that LVTSCR 500 has an n+ (floating drain) finger region 510 that is formed in both p– material 410 and n– well 412, and a channel region 512 that is located between and contacts n+ (source) finger region 424 and n+ (floating drain) finger region 510.

In addition, LVTSCR 500 includes a gate oxide layer 514 that is formed on p– material 410 over channel region 512, a gate 516 that is formed on gate oxide layer 514, and a layer of metal silicide 518 that is formed on n+ finger region 510. N+ (source and drain) regions 424 and 510, gate oxide layer 514, gate 516, and metal silicide layer 518 define an NMOS transistor 520 which is typically formed to be identical to the to-be-protected MOS transistors in the circuit.

In operation, when the voltage on metal region 432 spikes up, the reverse-biased junction between n+ floating drain finger region 510 and p– semiconductor material 410 breaks down at, for example, seven volts. Once the reverse-biased junction breaks down, the break down triggers LVTSCR 500 to operate the same as SCR 400.

As above, the npn and pnp transistors of LVTSCR 500 first turn on in a local region that lies close to n+ region 416. Once turned on locally, LVTSCR 500 turns on fully, over time, as a conductivity modulation front propagates down the finger. By turning LVTSCR 500 on in two steps, LVTSCR 500 can be turned on faster than LVTSCR 200.

Figure 6A:
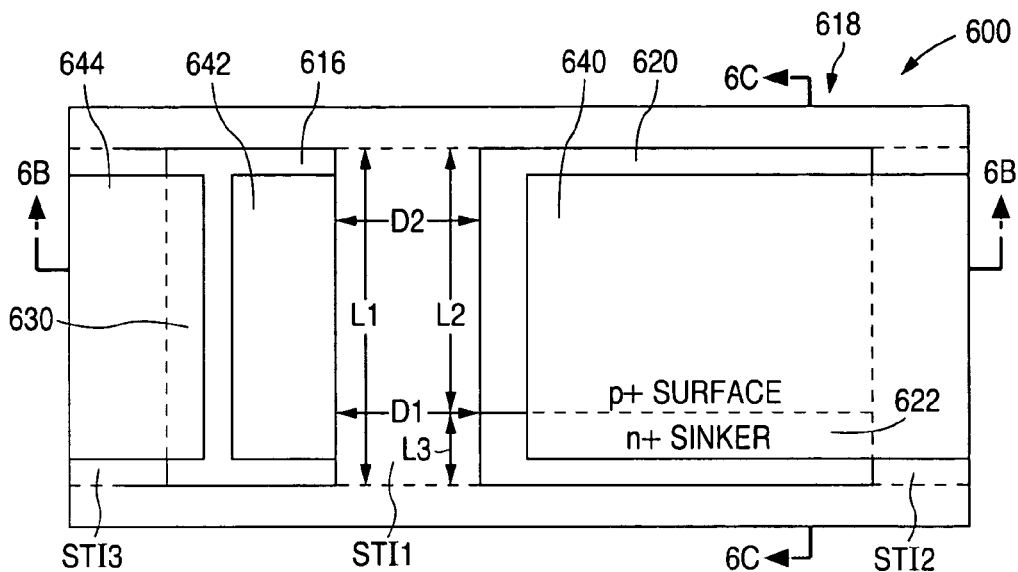
FIGS. 6A–6C are views illustrating a bipolar SCR (BSCR) 600 in accordance with the present invention.
Figure 6B:
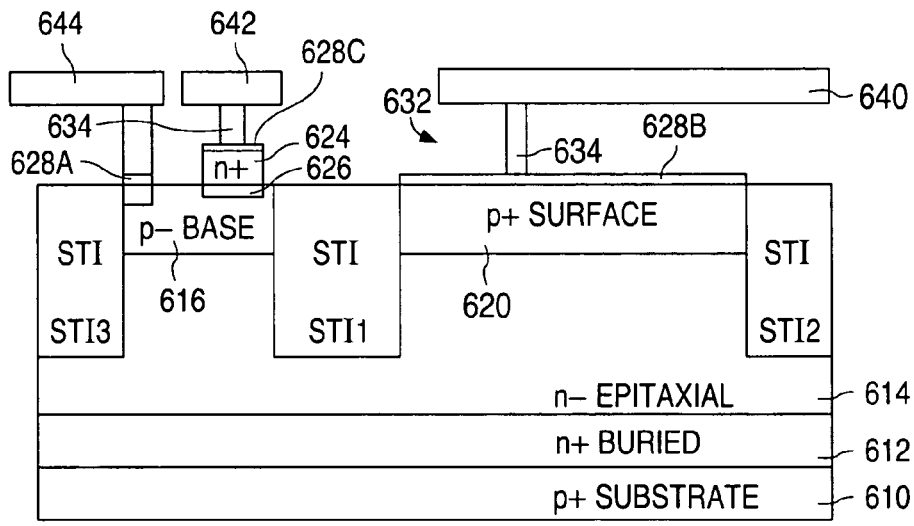
Figure 6C:
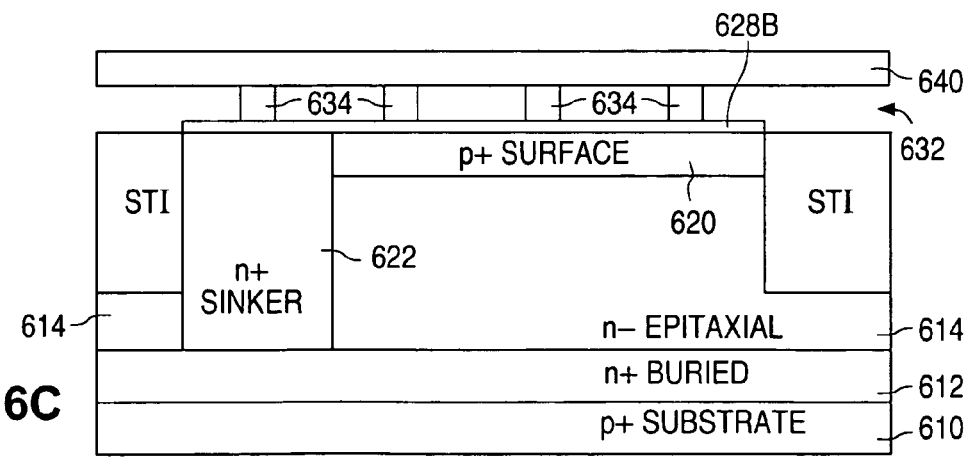

FIGS. 6A–6C show views that illustrate a bipolar SCR (BSCR) 600 in accordance with the present invention. FIG. 6A shows a plan view of BSCR 600, while FIG. 6B shows a cross-sectional view taken along line 6B—6B of FIG. 6A and FIG. 6C shows a cross-sectional view taken along line 6C—6C of FIG. 6A.

As shown in FIGS. 6A–6C, BSCR 600 includes a p– substrate 610, an n+ buried layer 612 that is formed in the top surface of substrate 610, and an n– epitaxial layer 614 that is formed on the top surface of substrate 610. BSCR 600 further has a trench isolation region STI that includes a first isolation section STI1, a second isolation section STI2, and a third isolation section STI3 that are formed in, and contact, n– epitaxial layer 614. The first, second, and third isolation sections STI1, STI2, and STI3 are spaced-apart and substantially parallel.

In addition, BSCR 600 includes a p– base finger region 616 that is formed in the top surface of n– epitaxial layer 614 between isolation sections STIL and STI3 to have a first length L1, and an anode structure 618 that includes a spaced-apart p+ surface finger region 620 that is formed in the top surface of n– epitaxial layer 614 to have a second length L2 that is shorter than the first length L1.

Anode structure 618 also includes an n+ sinker region 622 that is formed in n– epitaxial layer 614 to have a third length L3 that is substantially shorter than the first length L1, and shorter than the second length L2. Lenghts L1, L2, and L3 are measured along substantially parallel or coincident lines. In this example, p+ surface finger region 620 and n+ sinker region 622 both lie between the first and second isolation sections STIL and STI2. In addition, a shortest distance D1 between p– base finger region 616 and n+ sinker region 622, and a shortest distance D2 between p– base finger region 616 and p+ surface finger region 620 are substantially equal.

BSCR 600 further includes an n+ polysilicon emitter region 624 that is formed on and along a region of the top surface of p– base region 616. In addition, outdiffusion from n+ emitter region 624 forms a small n+ region 626 in the top surface of p– base region 616. In addition, BSCR 600 includes a first metal silicide layer 628A that is formed on and along an edge of p-base region 616, a second metal silicide layer 628B that is formed on p+ surface finger region 620 and n+ sinker region 622, a third metal silicide layer 628C that is formed on polysilicon emitter region 624.

BSCR 600 also includes a layer of isolation material 632 that is formed over epitaxial layer 614, and a plurality of contacts 634 that are formed through isolation layer 632 to make an electrical connection with p– base region 616 via metal silicide layer 628A, p+ surface finger region 620 and n+ sinker region 622 via metal silicide layer 628B, and n+ emitter region 624 via metal silicide layer 628C.

Further, a first metal region 640, which can function as the anode of an ESD diode structure (where the anode is connected to a to-be-protected device, such as the gate of a MOS transistor), is formed on isolation layer 632 to make an electrical connection with the contacts 634 that are connected to p+ surface finger region 620 and n+ sinker region 622.

In addition, a second metal region 642, which can function as the cathode of the ESD diode structure (where the cathode is connected to a grounding node), is formed on isolation layer 632 to make an electrical connection with the contacts 634 that are electrically connected to n+ poly emitter region 624. A third metal region 644, which can be resistively connected to second metal region 642, is formed on isolation layer 632 to make an electrical connection with the contacts 634 that are electrically connected to p– base region 616 (region 616 includes a heavily-doped region below the contact 634).

BSCR 600 forms an npn bipolar transistor that utilizes n+ region 626 as the emitter, p– base region 616 as the base, and n+ buried layer 612, n– epitaxial layer 614, and n+ sinker region 622 as the collector. BSCR 600 also forms a pnp transistor that utilizes p+ surface finger region 620 as the emitter, n+ buried layer 612 and n– epitaxial layer 614 as the base, and p-type region 616 as the collector.

In operation, when the voltage on metal region 640 is greater than the voltage on metal region 642 by a difference voltage that is less than the breakdown voltage, the voltage reverse biases the junction between n– epitaxial layer 614 and p– base 616. The reverse-biased junction, in turn, blocks charge carriers, other than leakage, from flowing from metal region 640 to metal region 642.

However, when the voltage on metal region 640 spikes up to be equal to or greater than the breakdown voltage, the reverse-biased junction breaks down due to avalanche multiplication. The breakdown of the junction causes a large number of electrons to be injected into n– epitaxial layer 614, and a large number of holes to be injected into p– base region 616 in a local region that lies close to n+ sinker region 622. The electrons injected into epitaxial layer 614 follow a current path through n– epitaxial layer 614, n+ buried layer 612, and n+ sinker region 622.

The increased number of electrons in n– epitaxial layer 614 reduces the potential at the pn junction between p+ surface finger region 620 and n– epitaxial layer 614 which, in turn, forward biases the pn junction between p+ surface finger region 620 and n– epitaxial layer 614, thereby allowing p+ surface finger region 620 to inject holes into n– epitaxial layer 614 in the local region.

In addition, the holes injected into p– base region 616 increase the potential in p– base region 616 which, in turn, forward biases the pn junction between p– base region 616 and n+ emitter region 626. When forward biased, n+ emitter region 626 injects electrons into p– base region 616 in the local region.

After the npn and pnp transistors of BSCR 600 have been turned on in the local region, which is adjacent to n+ sinker region 622, the regions of the npn and pnp transistors of BSCR 600 that lie further away from the local region turn on over time through the propagation of a conductivity modulation front that moves down p+ surface finger 620.

Further, the accumulation of positive charge in p– base region 616, and the accumulation of negative charge in epitaxial layer 614 due to the injection of large numbers of holes and electrons, respectively, reduces the magnitude of the reversed biased junction until the pn junction between p– base region 616, and n– epitaxial layer 614 switches and becomes forward biased. Once the pn junction between p– base region 616 and n– epitaxial layer 614 becomes forward biased, a large current flows in the local region from the anode to the cathode, while the anode-to-cathode voltage drops to a holding voltage that is substantially lower than the breakdown voltage.

Thus, in accordance with the present invention, like SCR 400, BSCR 600 is turned on in two steps: a first step wherein the npn and pnp transistors turn on locally, and a second step wherein BSCR 600 is fully turned on over time as the turned on condition propagates down p+ surface finger 620. The npn and pnp transistors locally turn on quicker due to the reduced capacitance associated with the local region. Once locally turned on, the conductivity modulation front rapidly propagates down p+ surface finger 620, fully turning on BSCR 600.

One of the advantages of BSCR 600 is that by turning on BSCR 600 in two steps, first locally, and then, over time, fully as a conductivity modulation front propagates down the finger, BSCR 600 can be turned on faster (the voltage on the anode falls from the breakdown voltage to the holding voltage in less time) than BSCR 300.

Figure 7A:
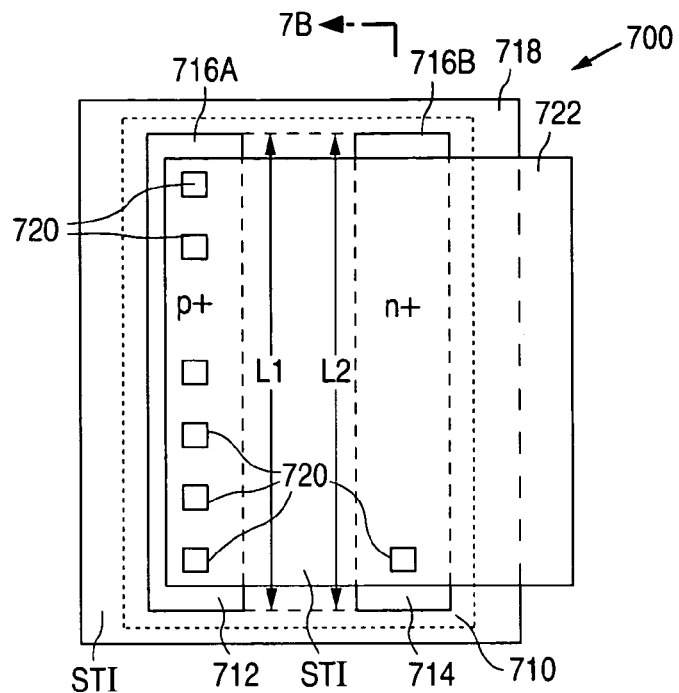
FIGS. 7A–7E are views illustrating a number of anode structures in accordance with the present invention.

FIGS. 7A–7E are views that illustrate a number of p+ emitter/collector structures in accordance with the present invention. FIG. 7A shows a plan view that illustrates an anode structure 700 in accordance with the present invention. Anode structure 700 can be used in lieu of anode structure 408 of SCR 400, anode structure 408 of LVTSCR 500, and anode structure 618 of BSCR 600.

As shown in FIG. 7A, anode structure 700 includes an n– region 710 which can be implemented with, for example, n– well 412 or n– epitaxial layer 614. In addition, structure 700 has a p+ finger region 712 that is formed in n– region 710 to have a first length L1, and an n+ finger region 714 that is formed in n– region 710 to have a second length L2. P+ and n+ finger regions 712 and 714, which are parallel to each other, are both connected to a to-be-protected node. As shown in the plan view, the first length L1 of p+ finger region 712 is substantially equal to the second length L2 of n+ finger region 714.

As further shown in FIG. 7A, anode structure 700 has a first layer of metal silicide 716A that is formed on p+ finger region 712, a second layer of metal silicide 716B that is formed on n+ finger region 714, and a layer of isolation material 718 that is formed on metal silicide layers 716A and 716B.

In addition, anode structure 700 has a number of conductive contacts 720 that are formed through isolation material 718 to make electrical connections with metal silicide layers 716A and 716B over p+ finger region 712 and n+ finger region 714, and a metal region 722 that is formed on isolation layer 718 to make electrical connections with the contacts 720.

In accordance with the present invention, anode structure 700 has only a single contact 720 connected to metal silicide layer 716B over n+ finger region 714. As a result, structure 700 has a resistance that is approximately equal to the sheet resistance of the silicide, e.g., 2Ω/square. Alternately, a small number of adjacent contacts 720, such as approximately one-tenth the number of contacts 720 that are formed to contact metal silicide layer 716A over p+ finger region 712, can also be used.

Figure 7B:
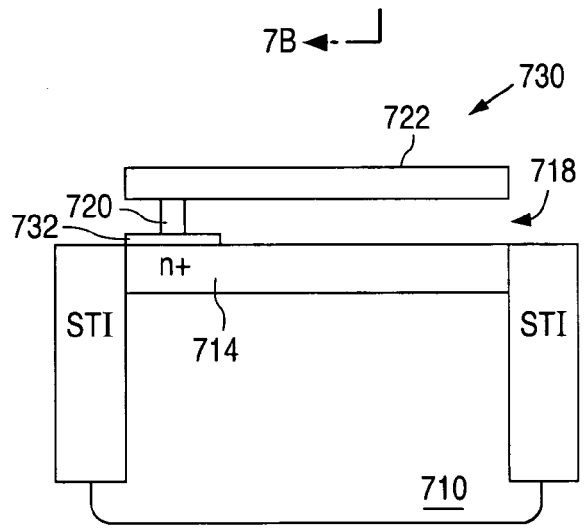

FIG. 7B shows a cross-sectional view taken along line 7B—7B of FIG. 7A that illustrates an anode structure 730 in accordance with the present invention. Anode structure 730 is similar to anode structure 700 and, as a result, utilizes the same reference numerals to designate the elements which are common to both structures.

As shown in FIG. 7B, anode structure 730 differs from anode structure 700 in that structure 730 utilizes a layer of metal silicide 732 that is only locally formed around contact 720 in lieu of metal silicide layer 716. As a result, structure 730 has a larger resistance than structure 700. Alternately, metal silicide layer 732 can be formed to contiguously cover only, for example, 10% of the surface area of n+ region 714.

Figure 7C:
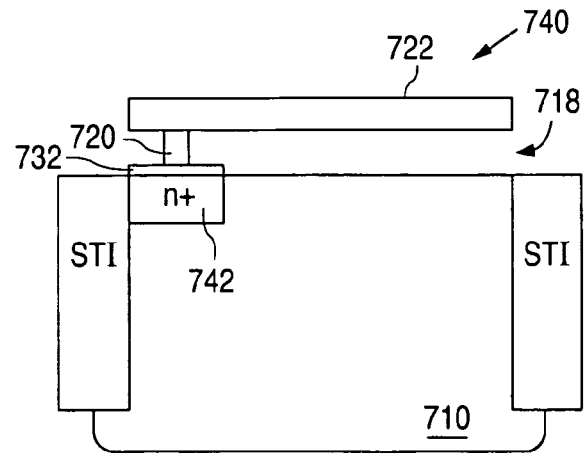

FIG. 7C shows a cross-sectional view taken along line 7B—7B of FIG. 7A that illustrates an anode structure 740 in accordance with the present invention. Anode structure 740 is similar to anode structure 730 and, as a result, utilizes the same reference numerals to designate the elements which are common to both structures.

As shown in FIG. 7C, anode structure 740 differs from anode structure 730 in that structure 740 has an n+ region 742 which is only locally formed around contact 720 and metal silicide layer 732. As a result, structure 740 has a larger resistance than structure 730. Alternately, n+ region 742 can be formed to have a length that is, for example, 10% of the length L1 of p+ finger region 712.

Figure 7D:
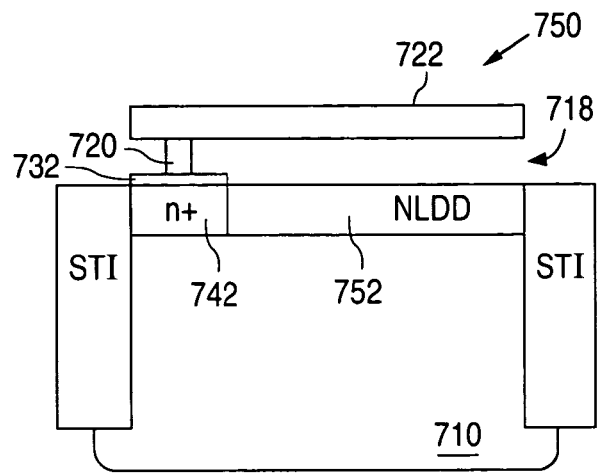

FIG. 7D shows a cross-sectional view taken along line 7B—7B of FIG. 7A that illustrates an anode structure 750 in accordance with the present invention. Anode structure 750 is similar to anode structure 740 and, as a result, utilizes the same reference numerals to designate the elements which are common to both structures.

As shown in FIG. 7D, anode structure 750 differs from anode structure 740 in that structure 750 has an NLDD finger region 752 which is formed in the surface of n– region 710. In addition, NLDD finger region 752 also contacts n+ region 742. As a result, structure 750 has a larger resistance than structure 730.

Figure 7E:
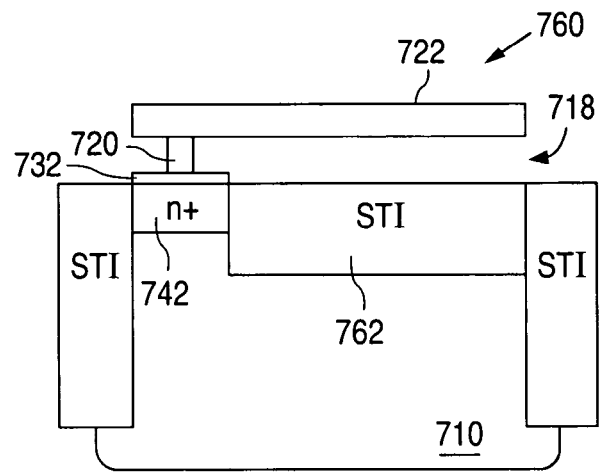

FIG. 7E shows a cross-sectional view taken along line 7B—7B of FIG. 7A that illustrates an anode structure 760 in accordance with the present invention. Anode structure 760 is similar to anode structure 740 and, as a result, utilizes the same reference numerals to designate the elements which are common to both structures.

As shown in FIG. 7E, anode structure 760 differs from anode structure 740 in that structure 760 has a shallow trench isolation (STI) region 762 which is formed in the surface of n– region 710. Further, STI region 762 contacts n+ region 742. As a result, structure 760 has a larger resistance than structure 730.

Anode structure 700 operates the same as anode structures 408 and 618 except that the point of local turn on is defined by the single contact 720 rather than the single n+ region 416 and 622, and the n+ region 714 is spaced further apart from the p− base region. Anode structure 730 operates the same as structure 700 except that the smaller region of silicide 732 increases the resistance.

Anode structure 740 operates the same as structure 730 except that the smaller n+ region 742 also increases the resistance. Anode structure 750 operates the same as structure 730 except that the NLDD finger region 752 increases the resistance. Anode structure 760 operates the same as structure 730 except that the STI region 762 increases the resistance.

Figure 8:
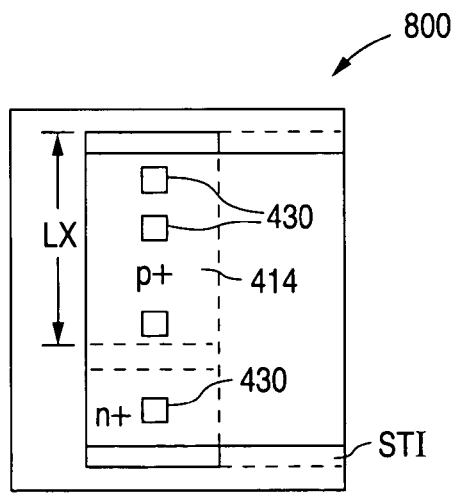
FIG. 8 is a plan view illustrating an anode structure 800 in accordance with the present invention.

FIG. 8 shows a plan view that illustrates an anode structure 800 in accordance with the present invention. Anode structure 800 is similar to anode structure 408 and, as a result, utilizes the same reference numerals to designate the elements which are common to both structures. As shown in FIG. 8, anode structure 800 differs from anode structure 408 in that structure 800 has a p+ finger region 414 with a length LX which is substantially equal to the length L1 of p+ finger region 114. Design rules often require a minimum separation distance the is sufficient to place a contact. As a result, n+ region 430 forms a side well connection.

Figure 9A:
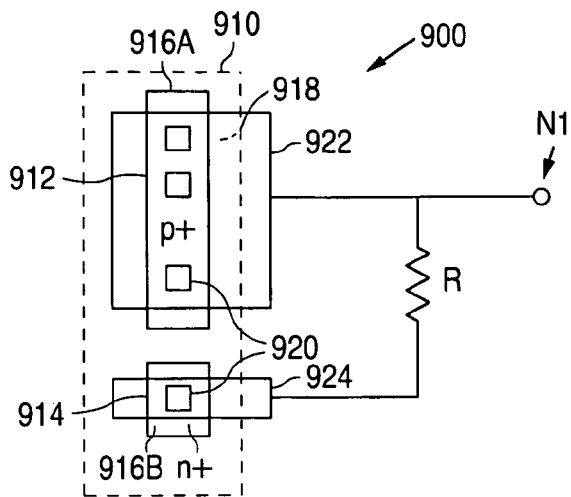
FIGS. 9A–9C are views illustrating a number of anode structures in accordance with the present invention.
Figure 9B:
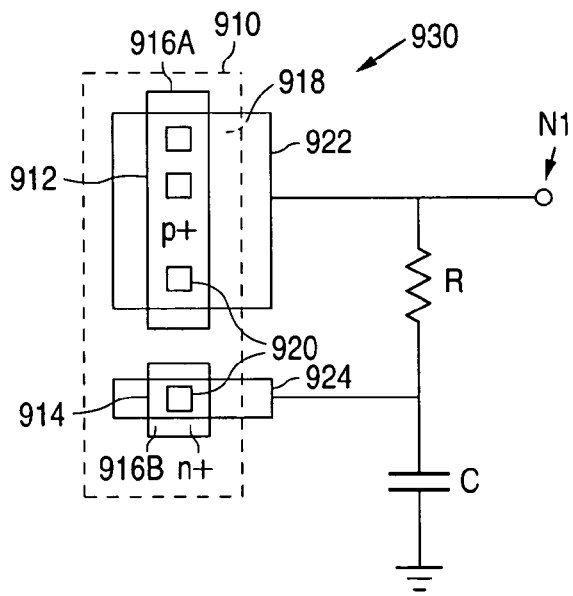
Figure 9C:
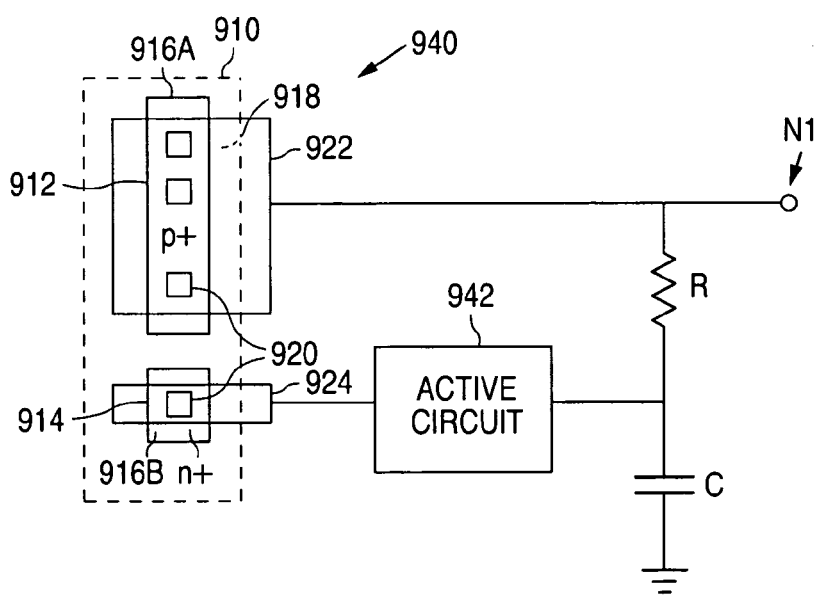

FIGS. 9A–9C are views that illustrate a number of anode structures in accordance with the present invention. FIG. 9A shows a plan view that illustrates an anode structure 900 in accordance with the present invention. Anode structure 900 can be used in lieu of anode structure 408 of SCR 400, anode structure 408 of LVTSCR 500, and anode structure 618 of BSCR 600.

As shown in FIG. 9A, anode structure 900 includes an n− region 910 which can be implemented with, for example, n− well 412 or n− epitaxial layer 614. In addition, structure 900 has a p+ finger region 912 that is formed in n− region 910, and a spaced-apart n+ region 914 that is formed in n− region 910.

As further shown in FIG. 9A, anode structure 900 has a first layer of metal silicide 916A that is formed on p+ finger region 912, a second layer of metal silicide 916B that is formed on n+ region 914, and a layer of isolation material 918 that is formed on metal silicide layers 916A and 916B.

In addition, anode structure 900 has a number of conductive contacts 920 that are formed through isolation material 918 to make electrical connections with metal silicide layers 916A and 916B over p+ finger region 912 and n+ region 914, respectively. Further, structure 900 includes a first metal region 922 that is formed on isolation layer 918 to make electrical connections with a to-be-protected node N1 and the contacts 920 that are connected to silicide layer 916A, and a second metal region 924 is formed on isolation layer 918 to make electrical connections with the contacts 920 connected to silicide layer 916B. Node N1 can be connected to, for example, the gates of MOS transistors.

In accordance with the present invention, anode structure 900 further has a resistor R that is connected to first and second metal regions 922 and 924, where n+ region 914 has only a single contact 920 connected to metal silicide layer 916B. As a result, structure 900 has a resistance that is a function of the value of resistor R.

FIG. 9B shows a plan view that illustrates an anode structure 930 in accordance with the present invention. Anode structure 930 is similar to anode structure 900 and, as a result, utilizes the same reference numerals to designate the elements which are common to both structures. As shown in FIG. 9B, anode structure 930 differs from anode structure 900 in that structure 930 has a capacitor C that is connected to resistor R, metal region 924, and ground. The RC circuit forms a passive driver circuit that supplies current to second metal region 924.

FIG. 9C shows a plan view that illustrates an anode structure 940 in accordance with the present invention. Anode structure 940 is similar to anode structure 930 and, as a result, utilizes the same reference numerals to designate the elements which are common to both structures. As shown in FIG. 9C, anode structure 940 differs from anode structure 930 in that structure 940 has an active circuit 942 connected to capacitor C and resistor R, and to metal region 924. Active circuit 942 can be implemented with, for example, CMOS inverters to form an active driver circuit that supplies current to second metal region 924.

It should be understood that the above descriptions are examples of the present invention, and that various alternatives of the invention described herein may be employed in practicing the invention. For example, the SCR structures of the present invention can be symmetrically replicated to have an SCR structure with many fingers. In this case, portions of an array which are electrically connected can be turned on in accordance with the two step process of the present invention. Thus, it is intended that the following claims define the scope of the invention and that structures and methods within the scope of these claims and their equivalents be covered thereby.

What is claimed is:

1. A silicon controlled rectifier structure comprising:
   a semiconductor region of a first conductivity type;
   a semiconductor region of a second conductivity type that contacts the semiconductor region of the first conductivity type;
   a first region of the first conductivity type that contacts the semiconductor region of the second conductivity type and is spaced apart from the semiconductor region of the first conductivity type, the first region having a first length;
   a second region of the second conductivity type that contacts the semiconductor region of the second conductivity type and is spaced apart from the semiconductor region of the first conductivity type, the second region having a second length and being spaced apart from the first region, the first and second lengths being measured along substantially parallel lines, the first length being substantially longer than the second length;
   a first isolation section that contacts the semiconductor region of the second conductivity type and the first region;
   a second isolation section that contacts the semiconductor region of the second conductivity type, the first region, and the second region, the first region lying between the first and second isolation sections; and
   a third isolation section that contacts the first and second isolation sections and isolates the first region from the second region.

2. The silicon controlled rectifier structure of claim 1 wherein the second region lies between the first and second isolation sections.

3. The silicon controlled rectifier structure of claim 2 and further comprising:
   a third region of the first conductivity type that contacts the semiconductor region of the first conductivity type and is spaced apart from the semiconductor region of the second conductivity type, the third region having a third length;

a fourth region of the second conductivity type that contacts the semiconductor region of the first conductivity type and is spaced apart from the semiconductor region of the second conductivity type, the fourth region having a fourth length and being spaced apart from the third region; and a fourth isolation section that contacts the semiconductor region of the first conductivity type, the third region, and the fourth region, the fourth isolation section lying between the third and fourth regions.

4. The silicon controlled rectifier structure of claim 3 wherein the fourth region contacts the first isolation section.

5. The silicon controlled rectifier structure of claim 4 wherein the fourth length is longer than the first length, substantially longer than the second length, and substantially equal to the third length.

6. The silicon controlled rectifier structure of claim 5 wherein:

the first and second regions are electrically connected together; and the third and fourth regions are electrically connected together.

7. The silicon controlled rectifier structure of claim 3 and further comprising:

a fifth region of the second conductivity type that contacts the semiconductor region of the first conductivity type and the semiconductor region of the second conductivity type, the fifth region having a fifth length, the fourth length and the fifth length being substantially equal.

8. The silicon controlled rectifier structure of claim 7 and further comprising:

a channel region located between the fourth and fifth regions;

a layer of gate oxide formed over the channel region; and a gate formed on the layer of gate oxide over the channel region.

9. The silicon controlled rectifier structure of claim 8 wherein:

the first and second regions are electrically connected together; and the third and fourth regions are electrically connected together.

10. The silicon controlled rectifier structure of claim 3 wherein the first, second and fourth isolation sections are substantially parallel.

11. The silicon controlled rectifier structure of claim 3 wherein a shortest distance between the third region and the second region, and a shortest distance between the first region and the third region are substantially equal.

12. A silicon controlled rectifier structure comprising:

a semiconductor region of a first conductivity type;

a semiconductor region of a second conductivity type that contacts the semiconductor region of the first conductivity type;

a first region of the first conductivity type that contacts the semiconductor region of the second conductivity type and is spaced apart from the semiconductor region of the first conductivity type, the first region having a first length;

a second region of the second conductivity type that contacts the semiconductor region of the second conductivity type and is spaced apart from the semiconductor region of the first conductivity type, the second region having a second length and being spaced apart from the first region, the first and second lengths being measured along substantially parallel lines, the first length and the second length being substantially equal;

a first isolation section that contacts the semiconductor region of the second conductivity type and the first region;

a second isolation section that contacts the semiconductor region of the second conductivity type, the first region, and the second region, the first region lying between the first and second isolation sections;

a first layer of metal silicide formed on the first region;

a second layer of metal silicide formed on the second region, the first and second layers of metal silicide being spaced apart;

a layer of isolation material formed on the first and second layers of metal silicide; and a plurality of contacts formed through the layer of isolation material to be electrically connected to the first and second regions via the first and second layers of metal silicide, respectively, the first layer of metal silicide being connected to ten times or more contacts than the second layer of metal silicide.

13. The silicon controlled rectifier structure of claim 12 wherein the first layer of metal silicide has a first contiguous area, and the second layer of metal silicide has a second contiguous area that is one-tenth or less the first contiguous area.

14. The silicon controlled rectifier structure of claim 13 wherein the second region includes a first section with a third contiguous area and heavy dopant concentration, and a second section with a fourth contiguous area and a dopant concentration that is less than the first section and greater than the semiconductor region of the second conductivity type.

15. The silicon controlled rectifier structure of claim 2 and further comprising a third region of the first conductivity type that contacts the semiconductor region of the first conductivity type and is spaced apart from the semiconductor region of the second conductivity type, the third region having a third length, the first and third lengths being substantially equal, the second length being less that the first and third lengths, the first, second, and third lengths being measured along substantially parallel lines.

16. The silicon controlled rectifier structure of claim 15 wherein a longitudinal centerline of the first region passes through the second region.

17. The silicon controlled rectifier structure of claim 12 and further comprising:

a first metal region formed on the layer of isolation material that is connected to the contacts that are electrically connected to the first region;

a second metal region formed on the layer of isolation material that is connected to the contacts that are electrically connected to the second region; and a resistor connected to the first and second metal regions.

18. The silicon controlled rectifier structure of claim 17 and further comprising a capacitor connected to the resistor and the second metal region.

19. The silicon controlled rectifier structure of claim 18 and further comprising an active circuit connected to the capacitor, the resistor, and the second metal region.

20. The silicon controlled rectifier structure of claim 2 wherein the first region has a dopant concentration greater than a dopant concentration of the semiconductor region of the first conductivity type, and the second region has a dopant concentration greater than a dopant concentration of the semiconductor region of the second conductivity type.

21. A silicon controlled rectifier structure comprising:
a first semiconductor region having a first conductivity type;
a second semiconductor region having a second conductivity type, the second semiconductor region contacting the first semiconductor region;
a first doped region of the first conductivity type that contacts the second semiconductor region, the first doped region being spaced apart from the first semiconductor region, and having a first dimension;
a second doped region of the second conductivity type that contacts the second semiconductor region, the second doped region contacting a region of the second semiconductor region that has a lower dopant concentration than a dopant concentration of the second doped region, being spaced apart from the first semiconductor region and the first doped region, and having a second dimension, the first and second dimensions being measured along substantially parallel lines, the first dimension being substantially longer than the second dimension;
an isolation region that contacts the second semiconductor region, the first doped region, and the second doped region, the isolation region lying between the first and second doped regions; and
a third doped region of the first conductivity type that contacts the second semiconductor region and the second doped region, the third doped region being spaced apart from the first semiconductor region and the first region, and having a third dimension measured along substantially parallel lines with the first and second dimensions.

22. The silicon controlled rectifier structure of claim 21 wherein the isolation region lies between the first doped region and the third doped region.

23. The silicon controlled rectifier structure of claim 21 wherein the third dimension is substantially longer than the second dimension, and shorter than the first dimension.

24. The silicon controlled rectifier structure of claim 23 and further comprising a fourth doped region of the second conductivity type that contacts the first doped region, wherein:
the first and fourth doped regions are electrically connected together; and
the second and third doped regions are electrically connected together.

25. The silicon controlled rectifier structure of claim 21 wherein a dopant concentration of the third doped region is greater than a dopant concentration of the first doped region.

26. A silicon controlled rectifier structure comprising:
a first semiconductor region having a first conductivity type;
a second semiconductor region having a second conductivity type, the second semiconductor region contacting the first semiconductor region;
a first doped region of the first conductivity type that contacts the second semiconductor region, the first doped region being spaced apart from the first semiconductor region, and having a first dimension;
a second doped region of the second conductivity type that contacts the second semiconductor region, the second doped region being spaced apart from the first semiconductor region and the first doped region, and having a second dimension, the first and second dimensions being measured along substantially parallel lines, the first dimension being substantially longer than the second dimension;
an isolation region that contacts the second semiconductor region, the first doped region, and the second doped region, the isolation region lying between the first and second doped regions;
a third doped region of the first conductivity type that contacts the first semiconductor region, the third doped region being spaced apart from the second semiconductor region, the first doped region, and the second doped region, the third doped region having a third dimension measured along substantially parallel lines with the first and second dimensions, the first dimension being substantially longer than the second dimension, and shorter than the third dimension; and
a fourth doped region of the second conductivity type that contacts the first semiconductor region, the fourth doped region being spaced apart from the second semiconductor region, the first doped region, the second doped region, and the third doped region.

27. The silicon controlled rectifier structure of claim 26 wherein a dopant concentration of the third doped region is substantially equal to a dopant concentration of the first doped region.

28. The silicon controlled rectifier structure of claim 27 wherein:
the first and second doped regions are electrically connected together; and
the third and fourth doped regions are electrically connected together.

29. The silicon controlled rectifier structure of claim 26 wherein a shortest distance between the first doped region and the third doped region, and a shortest distance between the second doped region and the third doped region are substantially equal.

30. The silicon controlled rectifier structure of claim 21 wherein a longitudinal centerline of the first doped region does not pass through the second doped region.

* * * * *

UNITED STATES PATENT AND TRADEMARK OFFICE
CERTIFICATE OF CORRECTION

PATENT NO. : 7,126,168 B1 Page 1 of 1
APPLICATION NO. : 10/821287
DATED : October 24, 2006
INVENTOR(S) : Vashchenko et al.

It is certified that error appears in the above-identified patent and that said Letters Patent is hereby corrected as shown below:

Column 3,

Line 47, delete "LVRSCR" and replace with --LVTSCR--.

Column 4,

Lines 10 and 26, delete "LVRSCR" and replace with --LVTSCR--.

Column 6

Line 55 and 63, delete "STIL" and replace with --STI1--.

Column 9

Lines 49 and 61, delete "STIL" and replace with --STI1--.

Signed and Sealed this

Second Day of January, 2007

JON W. DUDAS
*Director of the United States Patent and Trademark Office*